(12) United States Patent
Takahashi et al.

(10) Patent No.: US 6,403,973 B1
(45) Date of Patent: Jun. 11, 2002

(54) ELECTRON BEAM EXPOSURE METHOD AND APPARATUS AND SEMICONDUCTOR DEVICE MANUFACTURED USING THE SAME

(75) Inventors: Hiroyuki Takahashi, Inagi; Masahide Okumura, Sagamihara; Koji Nagata, Hachioji; Kimiaki Ando, Hamura, all of (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 09/498,617

(22) Filed: Feb. 7, 2000

(30) Foreign Application Priority Data

Feb. 26, 1999 (JP) .............................. 11-049390

(51) Int. Cl.⁷ .............................................. H01J 37/30
(52) U.S. Cl. ................... 250/492.22; 250/492.2
(58) Field of Search ........................ 250/442.11, 310, 250/311, 400, 398, 492.22, 492.23, 492.2

(56) References Cited

U.S. PATENT DOCUMENTS

| | | | | |
|---|---|---|---|---|
| 5,030,836 A | * | 7/1991 | Kusui et al. | 250/492.22 |
| 5,225,684 A | * | 7/1993 | Taki et al. | 250/492.2 |
| 6,107,636 A | * | 8/2000 | Muraki | 250/492.2 |

FOREIGN PATENT DOCUMENTS

JP        2-102519         4/1990

OTHER PUBLICATIONS

Journal Vac. Science Technology, B, 11(6), Nov./Dec. 1993, "Continuous writing method for high speed electron-beam direct writing system HL-800D".

* cited by examiner

Primary Examiner—John R. Lee
Assistant Examiner—Anthony Quash
(74) Attorney, Agent, or Firm—Mattingly, Stanger & Malur, P.C.

(57) ABSTRACT

The present invention provides an electron beam exposure method and an exposure apparatus suitable for use in the electron beam exposure technology for performing exposure on a sample placed on a sample table by an electron beam while continuously moving the sample table, both of which are capable of performing high-accuracy and high-speed exposure without being affected by glitch noise of a DA converter used for trace deflection of the electron beam. Displacements of the position of the sample table and the position to apply the electron beam are determined and the determined displacements are divided into the amount of a shot synchronous trace and the amount of a real time trace each synchronized with shot timing for applying the electron beam to thereby reduce the amount of the real time trace, whereby degradation in exposure accuracy due to the glitch noise of the DA converter used for trace deflection is prevented from occurring. It is therefore possible to carry out high-accuracy exposure. Since the number of trace region pass-changeovers can be reduced by increasing the range of trace deflection, wasted time can be reduced and hence high-speed exposure is made possible.

8 Claims, 5 Drawing Sheets

ELECTRON BEAM EXPOSURE METHOD AND APPARATUS AND SEMICONDUCTOR DEVICE MANUFACTURED USING THE SAME

BACKGROUND OF THE INVENTION

The present invention relates to an electron beam exposure method for performing exposure while a sample table is being moved continuously and an apparatus and a device using the same, and particularly to an electron beam exposure method and apparatus capable of preventing degradation in the accuracy of exposure due to glitch noise of a DA converter and reducing the number of trace region pass-changeovers, and a device manufactured using the same.

As one of methods for implementing high throughput of an electron beam exposure apparatus may be mentioned continuous shifting exposure for performing exposure while a sample table is being moved continuously. Trace control for first detecting the amount of movement of the sample table and next feeding back the amount of movement thereof for the purposes of the deflection of an electron beam in real time is essential to perform the continuous shifting exposure. For example, Continuous writing method for high is speed electron-beam direct writing system HL-800D (J.Vac.Sic.Technol.B11(6)) is disclosed as an example of the trace control, which has been known to date.

FIG. 3 is a diagram for describing the trace control method employed in the above-described conventional example.

The operation of FIG. 3 will be explained. Exposure is effected on a sample 11 placed on a sample table 12 by means of an electron beam 10 while the sample table 12 is being moved continuously. First, a laser interferometer 2 measures the coordinates of the sample table 12 with the exposure sample 11 placed thereon. A trace signal calculation unit 6 calculates the amount of deflection equivalent to displacements of the coordinates of the sample table 12 and coordinates to apply the electron beam, i.e. trace deflection data. A pattern generator 1 is capable of generating various device's pattern data inclusive of the sample 11. Exposure deflection data outputted from the pattern generator 1 and trace deflection data outputted from the trace signal calculation unit 6 are respectively converted to analog values by DA converters 7 and 8. These two analog values are added together by an analog adder 9, followed by input to a deflector 5. Thus, the deflector 5 deflects the electron beam 10 to a desired position on the exposure sample 11.

A cycle for updating trace deflection data calculated by the trace signal calculation unit 6 is determined from the transfer speed of the sample table 12 and required exposure accuracy. Namely, the updating cycle becomes short as the transfer speed of the sample table 12 becomes fast and the exposure accuracy becomes high. In the conventional example, the trace signal or trace deflection data is updated in a cycle of 100ns (10MHz). Since the DA converter 7 used for exposure deflection and the DA converter 8 used for trace deflection are different in required property, DA converters 7 and 8 dedicated to them are provided. Namely, the DA converter 7 used for exposure deflection is activated in synchronism with applying (shot) timing of the electron beam and the electron beam is applied after the output thereof has been settled. Thus, since the settling time of the DA converter 7 results in exposure wasting time, its responsivity must be made fast. On the other hand, the DA converter 8 used for trace deflection needs to update data in a cycle shorter than the DA converter 7, i.e., during the application of the electron beam. Therefore, DA converters small in glitch noise produced upon changes in the outputs of the DA converters are used.

When the amount of deflection based on the trace deflection exceeds a predetermined value, a trace region pass-changeover operation for adding the amount of the trace deflection to the amount of deflection of a high-level deflector 23 and restoring the amount of the trace deflection to the initial value is performed. Namely, when the amount of the deflection exceeds the predetermined value since the high-level deflector 23 shown in FIG. 3 has a deflection range larger than that of the low-level deflector 5, the trace deflection data is transferred from the trace signal calculation unit 6 to a DA converter 22 for the deflector 23 through the pattern generator 1, and the value calculated by the trace signal calculation unit 6 is returned to 0.

Since the amount of movement of the sample table 12 can be fed back for the deflection of the electron beam 10 in real time according to the above-described exposure method, exposure can be implemented at high speed and with high accuracy while the sample table 12 is being moved continuously.

As described above, the DA converter is used for the deflection of the electron beam in the electron beam exposure apparatus. The DA converter is commonly comprised of a plurality of current sources different in weight. There are provided switches for turning on and off the respective current sources. Necessary values are selected from the plurality of current sources and the selected outputs are added together and thereafter outputted, whereby an arbitrary large output can be obtained. Since, however, the respective switches vary in operating time, a current having an unintentional magnitude might be outputted when data is switched over to another. This is called "glitch noise". The magnitude of the glitch noise is determined depending on the number of the activated switches and the sizes of the current sources switched thereby. Thus, the maximum glitch noise is produced in the case of a ½ full scale at which all the bits of input data are inverted. If a full scale 15 is represented in 4 bits based on a binary number (four switches), for example, then the maximum value results in '1111' (15 represented in a decimal number) and the minimum value results in '0000' (0 similarly). Since the ½ full scale is set between 7 and 8, all the bits are interchanged at the time of a changeover from '0111' to '1000', so that switching timings of all the switches are mismatched with one another, thus leading to the generation of the maximum glitch noise.

Since the generation of the glitch noise is a problem about the structure of each DA converter in this way, it is very difficult to reduce the glitch noise. Although the glitch noise can be reduced by inserting a filter, a delay in response is produced so that it could not lead to practical applications.

The deflection of the electron beam by the electron beam exposure apparatus of the sample table continuous shifting system can be roughly divided into exposure deflection for exposure and trace deflection for trace control. As to the exposure deflection, deflection data is set to a DA converter and a beam is kept in an off state until the output thereof is settled. Thus, the glitch noise produced upon transition of the output does not influence the result of exposure. On the other hand, the trace deflection for feeding back the amount of movement of a sample table is deflection for correcting the amount of movement of the continuously-moved sample table according to the deflection of the electron beam. Therefore, the glitch noise is produced in the DA converter 8 in FIG. 3. The execution of high-accuracy trace deflection needs to update trace deflection data in a short cycle. It is thus necessary to update the trace deflection data in a cycle shorter than that for graphics exposure, and the data is updated even during the application of the electron beam. When the trace deflection data is brought to data which causes large glitch noise in the DA converter, a displacement in exposure position due to the influence of the glitch noise occurs, so that the accuracy of exposure is degraded. Thus, it is necessary to limit the range of trace deflection so that the DA converter is used within a range represented in such a level that the glitch noise does not influence exposure.

However, a problem arises in that when the range of the trace deflection becomes narrow, the number of trace region pass-changeovers increases and a reduction in exposure speed occurs due to wasting time produced at this time.

SUMMARY OF THE INVENTION

Therefore, an object of the present invention is to provide an electron beam exposure method and apparatus capable of solving these conventional problems and preventing degradation in the accuracy of exposure due to glitch noise of a DA converter used for trace deflection to thereby carry out high-accuracy exposure, and increasing a tracing range to thereby reduce the number of trace region pass-changeovers and provide high-speed exposure.

In order to achieve the above object, there is provided an electron beam exposure apparatus according to the present invention, comprising means for determining displacements of a position of a sample table and a position to apply an electron beam, a first trace deflection correcting unit for determining a first amount of trace deflection for correcting the determined displacements in synchronism with timing provided to apply the electron beam, a second trace deflection correcting unit for setting the amount of correction by the first trace deflection correcting unit as the point of origin and determining a second amount of trace deflection for correcting the amount of a variation from the point of origin in a cycle shorter than a correcting cycle for the first trace deflection correcting unit, and wherein the first amount of trace deflection and the second amount of trace deflection are added to the amount of deflection of an electron beam for graphics exposure and the result of addition is outputted, whereby the displacements of the position of the sample table and the position to apply the electron beam are corrected.

There is also provided an electron beam exposure method according to the present invention, comprising the following steps of calculating displacements of a position of a moved sample table and a position to apply an electron beam, sampling the calculated displacements in synchronism with timing provided to apply the electron beam, calculating a first amount of trace deflection for correcting the sampled displacement according to the deflection of the electron beam, setting the first amount of trace deflection as the point of origin and calculating a second amount of trace deflection for correcting the amount of a variation therefrom in a cycle shorter than a calculation cycle for the first amount of trace deflection, adding the first amount of trace deflection and the second amount of trace deflection to the amount of exposure deflection data calculated by a pattern generator, and driving a deflector according to the added amount of deflection data.

Thus, the value or amount corrected by the second trace deflection correcting unit activated in the short cycle during the application of the electron beam can be limited to a slight value, and the glitch noise can be prevented from occurring.

Further, the addition of an offset to the first amount of trace deflection and the second amount of trace deflection allows avoidance of bit patterns large in glitch, and the number of trace region pass-changeovers can be reduced by increasing a tracing range.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
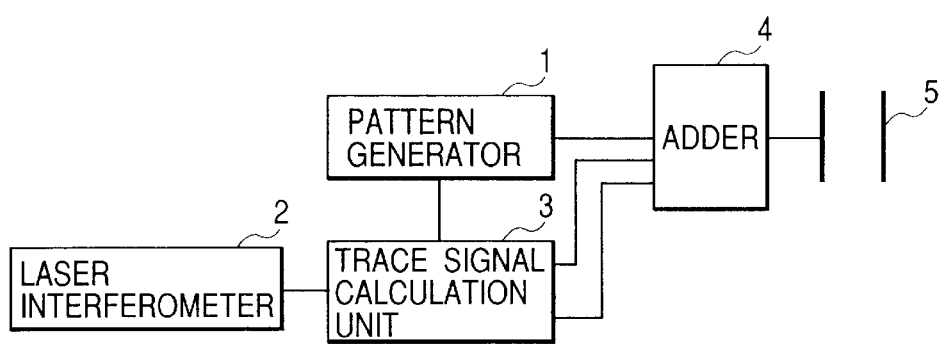
FIG. 1 is a diagram for describing a basic electron beam exposure method of the present invention.
Figure 2:
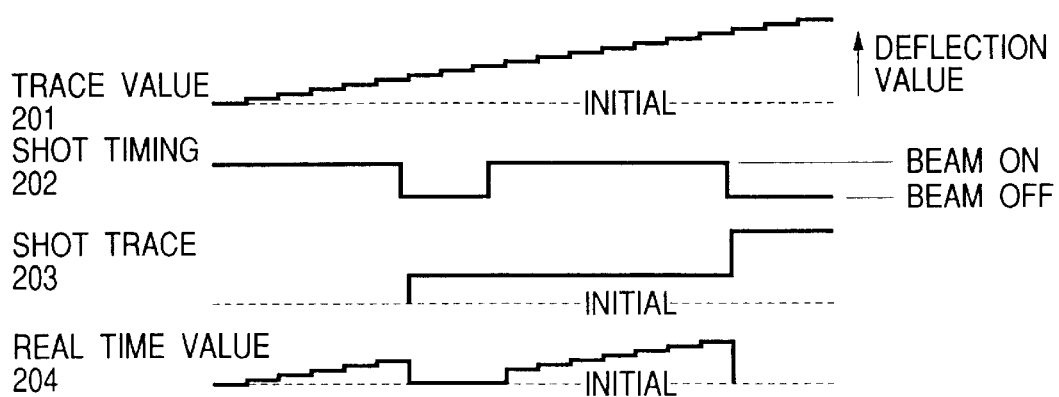
FIG. 2 is a waveform chart showing operations of essential parts of an electron beam exposure apparatus illustrative of one embodiment of the present invention.
Figure 3:
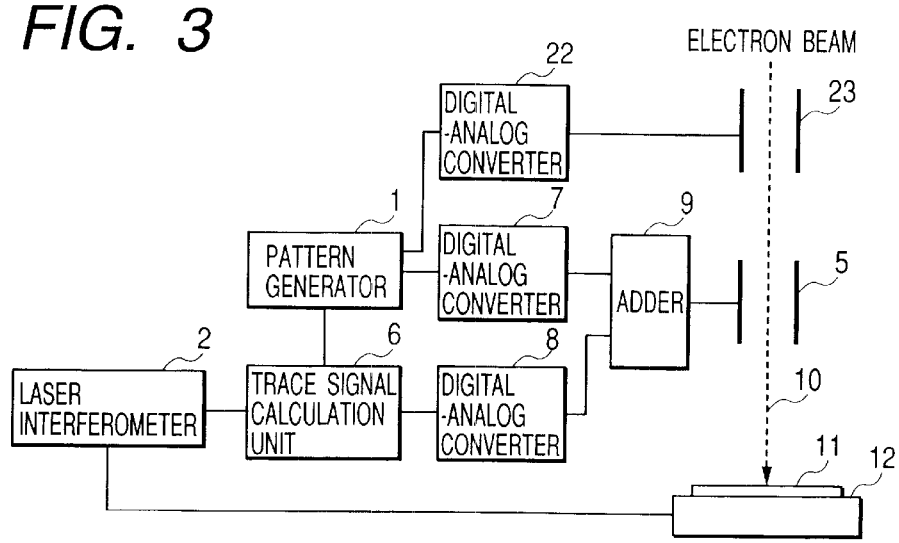
FIG. 3 is a fragmentary block diagram of a conventional electron beam exposure apparatus.

FIG. 1 is a diagram showing a basic configuration of an electron beam exposure apparatus of the present invention, and FIG. 2 is a diagram illustrating operational waveforms according to the present invention, respectively.

Basic components of the electron beam exposure apparatus comprise a pattern generator 1 for outputting exposure deflection data therefrom, a laser interferometer 2 for measuring the coordinates of a sample table on which a sample is placed, a trace signal calculation unit 3 for computing the amount of trace deflection or trace value, an adder 4 and a deflector 5.

The laser interferometer 2 measures the coordinates of the sample table and outputs the result of measurement to the trace signal calculation unit 3. Graphics deflection data is outputted from the pattern generator 1 to the trace signal calculation unit 3. The trace signal calculation unit 3 first calculates the amount of deflection of the electron beam, which is equivalent to displacements of coordinates (shot coordinates) to apply an electron beam and the coordinates of the sample table according to the coordinates of the sample table and the graphics deflection data and performs a deflection distortion correction, thereby determining a trace deflection value or the amount of trace deflection. Since the amount of trace deflection reflects the amount of movement of the sample table continuously moved in one direction, the value thereof results in a waveform designated at numeral 201 in FIG. 2, in which it successively increases. Next, the trace signal calculation unit 3 samples shifts or displacements in the coordinates of the sample table and the shot coordinates in synchronism with timing (shot timing designated at numeral 202 in FIG. 2) provided to apply the electron beam. Here, the sampled amount of trace deflection will be defined as the amount of a shot synchronous trace. The amount of the shot synchronous trace results in a waveform having values varied every shot timings.

Further, the trace signal calculation unit 3 defines the amount of the shot synchronous trace as the point of origin, defines the amount of change therefrom, i.e., the amount of change in the amount of trace deflection while the electron beam is being applied, as the amount of a real time trace or real time trace value, and calculates it in a cycle shorter than that of the shot timing. The amount of the real time trace results in a waveform in which the amount of deflection is varied in such a short cycle as designated at numeral 204 in FIG. 2. The amount of the shot synchronous trace and the amount of the real time trace are added together by the adder 4, and the deflector 5 is driven according to the added amount of trace to thereby deflect the electron beam. Owing to the execution of trace control by such a method, the amount of the real time trace whose each value changes while the electron beam is being applied, can be controlled or limited to a very small value. As a result, a DA converter used for real-time trace deflection can be used only in a range in which glitch noise is small, and high-accuracy trace control is made possible.

For simplification of illustration, now consider a DA converter of a type wherein a full scale 15 is represented in 4 bits based on a binary number (four switches) as the previous example. In this case, if the DA converter is limited to a change in range in which only the switches corresponding to the rightmost two bits are changed over, between the maximum value '1111' (15 expressed in a decimal number) and the minimum value '0000' (0 similarly), no large glitch noise is produced even if a mismatch between switching timings occurs.

Figure 4:
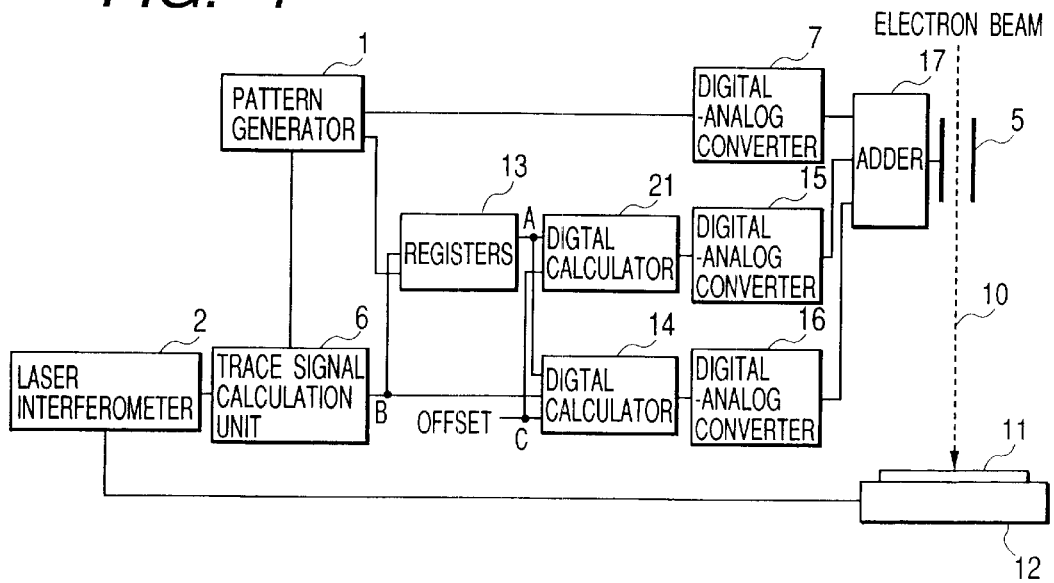
FIG. 4 is a fragmentary block diagram of an electron beam exposure apparatus showing a first embodiment of the present invention.

FIG. 4 is a block diagram of an electron beam exposure apparatus showing a first embodiment of the present invention. A laser interferometer 2 measures the coordinates of a sample table 12 and outputs the amount of measurement to a trace signal calculation unit 6. Since it is necessary to, feed back the amount of movement of the sample table 12 to the amount of deflection of an electron beam in real time, trace control on the sample table 12 is carried out independent of operation related to graphics drawing or exposure. A cycle for updating the sample table coordinate data outputted from the laser interferometer 2 is determined from the accuracy required for the trace control and the transfer speed of the sample table. When the maximum speed of the sample table 12 is defined as 100 mm/s and the accuracy required for the trace control is defined as 10 nm, for example, it is necessary to update data in a cycle of 100 ns.

The trace signal calculation unit 6 calculates trace deflection data in which a deflection distortion correction is effected on the difference between the sample-table coordinates and shot coordinates and outputs the result of calculation to a register 13 and a digital calculator 14. Latch timing of the register 13 is synchronized with shot timing and data stored in the register 13 will be defined as shot synchronous trace data. Namely, the trace signal calculation unit 6 performs a calculation in a short cycle and outputs the result thereof to the register 13. On the other hand, the register 13 latches the result thereof therein in synchronism with shot timing of a cycle longer than the short cycle referred to above. Assuming now that the (shot synchronous trace data) is defined as A, the (trace deflection data) is defined as B and an (offset) is defined as C, respectively, the output of the register 13, the output of the trace signal calculation unit 6 and an offset terminal (Offset) are respectively supplied with A, B and C as shown in FIG. 4. The two digital calculators 21 and 14 perform the following calculations respectively and output the results thereof to their corresponding DA converters 15 and 16.

Namely, the digital calculator 21 calculates A−C and outputs the result thereof to the DA converter 15. One digital calculator 14 calculates B−A+C and outputs the result of calculation to the DA converter 16. In the present embodiment, the data calculated by the digital calculator 14 will be defined as real time trace data. Thus, when the (A−C) calculated by the digital calculator 21 and the (B−A+C) calculated by the digital calculator 14 are added together by an analog adder 17, only the trace deflection data B is left as the sum thereof.

Since the real time trace data is regarded as the amount of movement of a sample table within a time interval during which an electron beam is being applied once, it results in a very small value. When the transfer speed of the sample table is regarded as 100 mm/s and the time required to apply the electron beam per once is defined as 1 $\mu$s, for example, the amount of the real time trace results in 100 nm at maximum.

A pattern generator 1 calculates exposure deflection data and outputs the result of calculation to a DA converter 7. The shot synchronous trace data outputted from the digital calculator 21 and the real time trace data outputted from the digital calculator 14 are respectively inputted to their corresponding DA converters 15 and 16 where they are converted into analog values respectively.

Incidentally, the way of adding such an offset is a method known to date. Even in the case of the present embodiment, an offset C is respectively added to the shot synchronous trace data A and the trace deflection data B by using this method. This reason is as follows: Let's now consider a DA converter in which a full scale 15 is expressed in 4 bits based on a binary number (four switches) as the previous example. In a point of a change from 7 to 8 of a ½ full scale maximum in glitch noise between the maximum value '1111' (15 expressed in a decimal number) and the minimum value '0000' (0 similarly), all the bits are interchanged at the time of a changeover from '0000' to '0000'. Thus, in the present embodiment, when, for example, 4 (i.e., 0100) is added to both 7 and 8 as an offset respectively, data are respectively brought to '1100' (12 in a decimal number) and '1011' (11 in the same manner as above). Regardless of the fact that the bit patterns are made great in this way, the switching points of the switches are defined as only the lower or rightmost three digits and only one switching point is reduced as compared with the case of the occurrence of the maximum glitch noise, whereby the glitch noise can be reduced. Since the number of trace region pass-changeovers can be reduced by increasing the tracing range in this way, wasting time can be reduced and correspondingly high-speed exposure can be carried out. Incidentally, since the DA converter is handled or processed in bipolar (±) values, the maximum glitch noise is produced in the case of the value 0. However, this case can be also avoided by the addition of an offset.

The analog adder 17 analogically adds the analog values outputted from the DA converters 7, 15 and 16. A deflector 5 is driven based on the output of the analog adder 17 so that an electron beam 10 is deflected to a desired position on an exposure sample 11. The execution of the trace control on the sample table 12 in this way allows a great reduction in the amount of real time trace deflection, which changes in the course of the application of the electron beam. The glitch noise, which has heretofore been raised as a problem, is one generated by the DA converter 16, which was produced since data inputted thereto changed in a large range. When the present invention is executed, the range of a change in real time trace data corresponding to the input data of the DA converter 16 becomes very small. Therefore, since the glitch noise can be also reduced to such an extent as not to influence exposure, high-accuracy exposure can be carried out.

Figure 6:
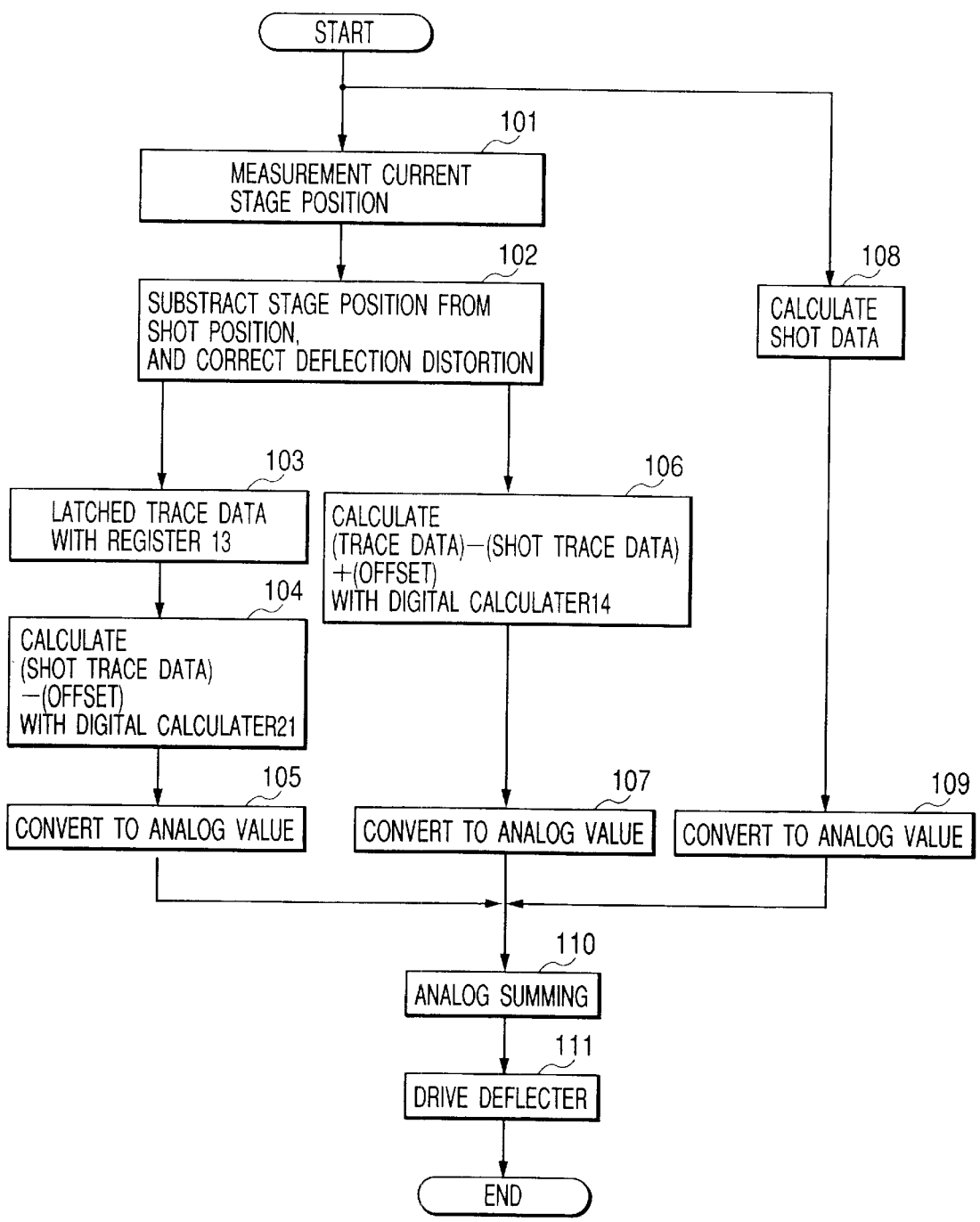
FIG. 6 is an operation flowchart of an electron beam exposure method showing a first embodiment of the present invention.
Figure 7A:
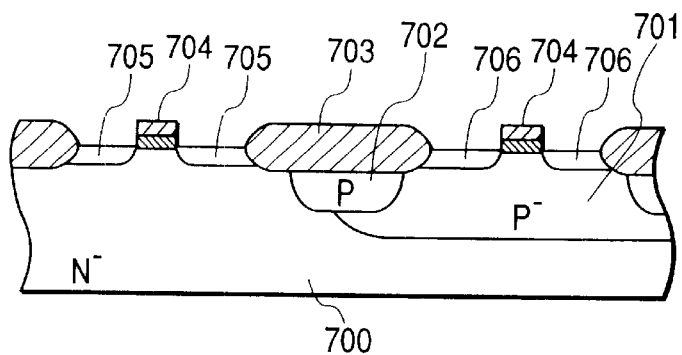
FIG. 7 is a cross-sectional view illustrating an embodiment in which the present invention is used in device production.
Figure 7B:
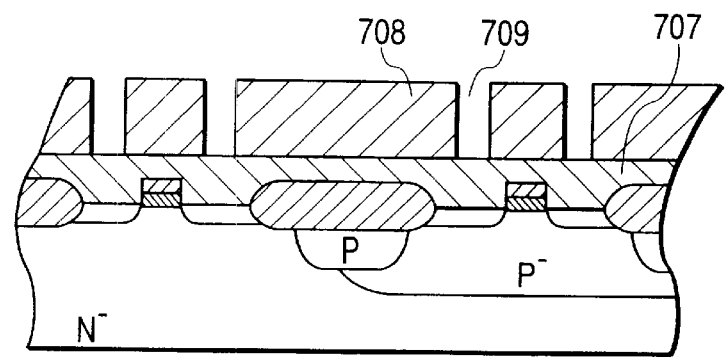
Figure 7C:
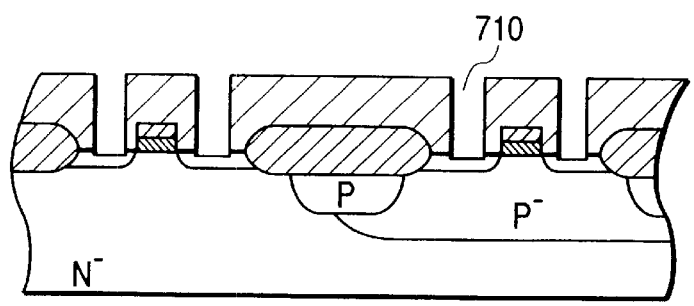
Figure 7D:
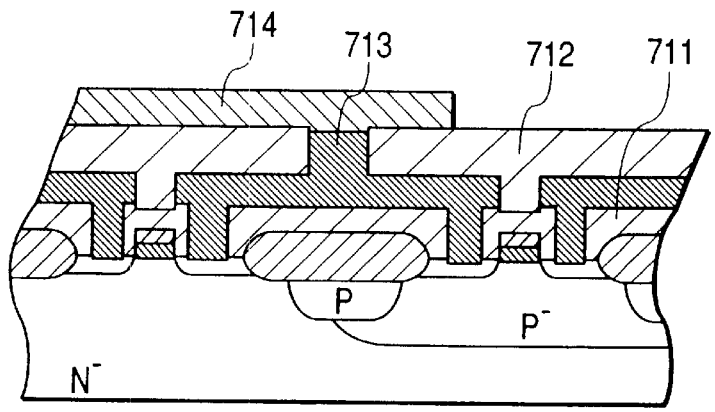

FIG. 6 is a flowchart for describing the operation of the electron beam exposure apparatus shown in FIG. 4. The electron beam exposure apparatus starts control with the movement of a sample table. The laser interferometer 2 first measures the coordinates of the sample table (Step 101). Next, the trace signal calculation unit 6 performs a deflection distortion correcting calculation on the difference between the coordinates of the sample table and shot coordinates (Step 102) and outputs the result of calculation thereof to the register 13 and digital calculator 14. When the register 13 latches the trace deflection data therein (Step 103) and outputs it to the digital calculator 21, where (shot synchronous trace data A)–(offset C) is calculated (Step 104). Further, the digital calculator 21 outputs the result of calculation thereof to the DA converter 15. The DA converter 15 converts a digital value to an analog value (Step 105).

On the one hand, the digital calculator 14 calculates (trace deflection data B)–(shot synchronous trace data A)+(offset C) (Step 106). Thereafter, the digital calculator 14 outputs the result of calculation thereof to the DA converter 16, where a digital value is converted to an analog value (Step 107).

On the other hand, the pattern generator 1 calculates exposure deflection data (Step 108) and outputs the result thereof to the DA converter 7. The DA converter 7 converts the input digital value to an analog value and outputs it to the analog adder 17 (Step 109).

The analog adder 17 analogically adds (A–C) calculated by the digital calculator 21, (B–A+C) calculated by the digital calculator 14 and the exposure deflection data calculated by the pattern generator 1 (Step 110), thereby driving the deflector 5 based on data about the result of addition (Step 111).

Figure 5:
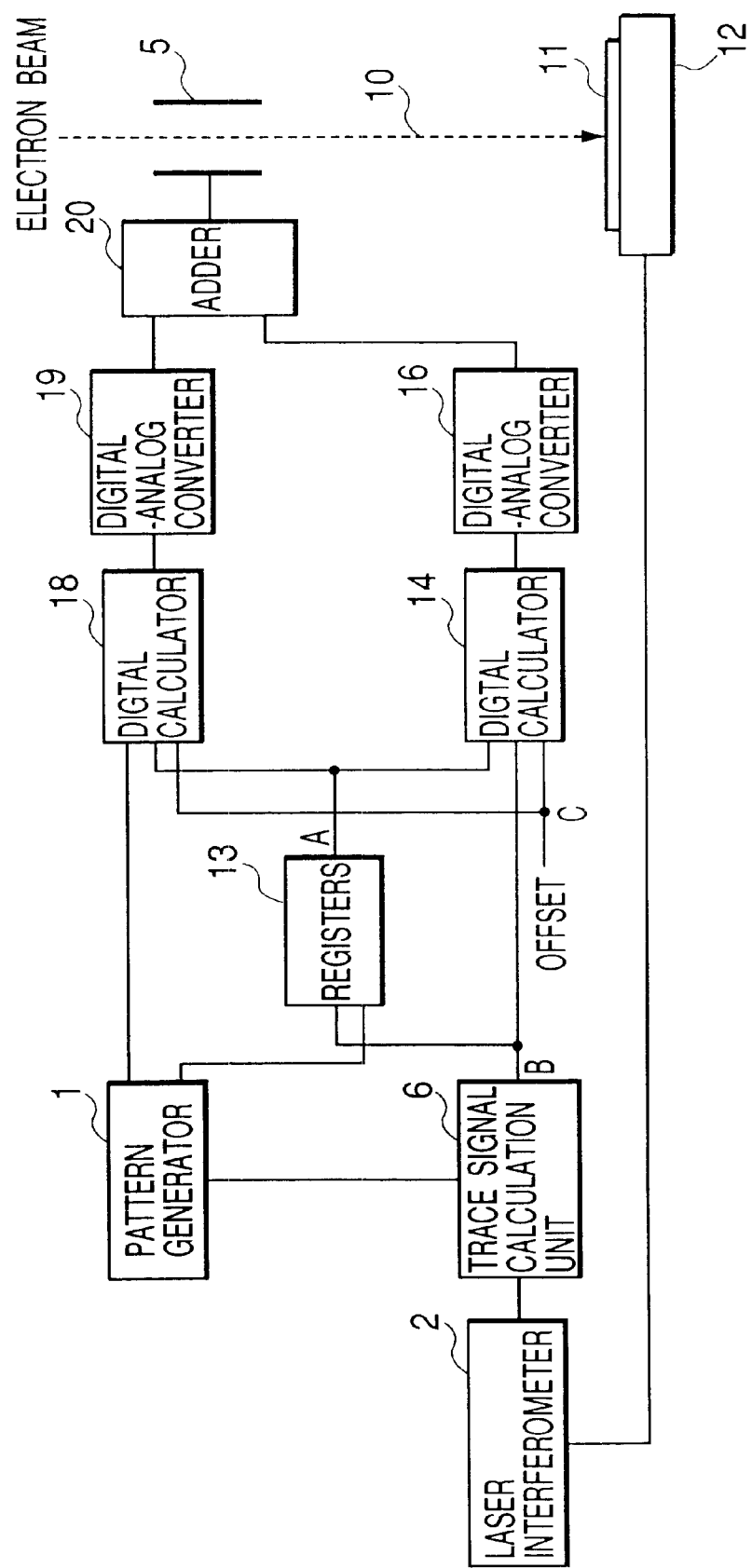
FIG. 5 is a block diagram of an electron beam exposure apparatus illustrating a second embodiment of the present invention.

FIG. 5 is a block diagram of an electron. beam exposure apparatus showing a second embodiment of the present invention. In the second embodiment, exposure deflection data outputted from a pattern generator 1 and shot synchronous trace data stored in a register 13 are digitally added together and thereafter inputted to a DA converter 19. Next, the outputs of the DA converter 19 and a DA converter 16 are added together by an analog adder 20. An electron beam side deflected by driving a deflector 5 based on the output of the analog adder 20. An effect similar to that obtained in the first embodiment can be obtained even by such a method. As is apparent if compared with FIG. 4, the number of the DA converters can be reduced by one in the second embodiment.

A method of updating the timing provided to sample the amount of the shot synchronous trace 203 shown in FIG. 2, each time the electron beam is applied plural times, can be also used. Namely, when the amount of the shot synchronous trace is calculated for each shot timing provided to apply the electron beam as designated at numeral 203 in FIG. 2 and latched in the register 13, there may be cases in which this will not be enough on a circuit basis. Thus, a first amount of trace deflection correction is sampled by the register 13 only once per two shot timings, for example to thereby cause the electron beam exposure apparatus to carry out smooth operation.

FIG. 7 is a cross-sectional view showing, an embodiment in which the present invention is used for device production. A semiconductor substrate or the like is exposed as an exposure sample 11 by using the electron beam exposure apparatuses having the configurations respectively illustrated in the embodiment of FIG. 4 and the embodiment of FIG. 5 and the electron beam exposure method described in the flow of FIG. 6, whereby the exposure can be carried out with extremely high accuracy and at high speed.

FIGS. 7(a) through FIG. 7(d) are respectively cross-sectional views of a device, showing its processes. A P well layer 701, P layers 702, field oxide films 703, polycrystalline silicon/silicon oxide film gates 704, P high-concentration diffused layers 705, N high-concentration diffused layers 706, etc. are formed over an N minus silicon substrate 700 by the normal method (see FIG. 7(a)). Next, an insulating film 707 of phosphorus glass (PSG) is formed thereon by the normal method. A resist 708 is applied on the insulating film 707 to thereby form hole patterns 709 by an, electron beam exposure apparatus of the present invention (see FIG. 7(b)). Next, the insulating film 707 is subjected to dry etching with a resist as a mask to thereby define contact holes 710 (see FIG. 7(c)).

Next, a resist is applied and hole patterns, 713 are formed by the normal method through the use of a translucent phase shift mask employed in the present invention. W plugs are respectively embedded in the hole patterns 713 and second interconnections 714 comprised of aluminum are connected thereto (see FIG. 7(d)). The subsequent passivation process made use of the conventional method. While only the main manufacturing processes have been described in the present embodiment, the same processes as those employed in the conventional method were used except for the use of the electron beam exposure apparatus of the present invention in the lithography process for defining the contact holes. According to the above-described processes, CMOSLSI can be manufactured with high yields. As a result of the fabrication of a semiconductor device by means of the electron beam exposure method of the present invention, a failure in conduction of each contact hole due to the displacement of a shot position of each hole pattern can be prevented from occurring, and the yield of good ones in products can be improved to about 10%.

According to the present invention as described above, the amount of trace deflection is divided into the amount of a shot synchronous trace and the amount of a real time trace each synchronized with shot timing, and the amount of real time trace deflection is reduced, whereby the degradation in the accuracy of exposure due to the glitch noise of the DA converter used for trace deflection is prevented from occurring. It is therefore possible to carry out high-accuracy exposure. Since the number of the trace region pass-changeovers can be reduced by increasing the trace range, wasting time can be reduced and high-speed exposure can be carried out correspondingly.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An electron beam exposure method of performing exposure according to the deflection of an electron beam while continuously moving a sample table with a sample placed thereon, comprising the following steps:

a step for determining displacements of a position of said sample table and a position to apply the electron beam;

a step for sampling said displacements in synchronism with shot timing provided to apply the electron beam and determining a first amount of trace deflection for correcting the sampled displacement according to the deflection of the electron beam;

a step for setting said first amount of trace deflection as the point of origin and determining a second amount of trace deflection for correcting the amount of a variation from the point of origin in a cycle shorter than a calculation cycle for the first amount of trace deflection;

a step for adding said first amount of trace deflection and said second amount of trace deflection to the amount of deflection of an electron beam for graphics exposure; and a step for performing said deflection according to the added deflection data to thereby prevent a glitch noise produced in the deflection of the electron beam.

2. An electron beam exposure method according to claim 1, wherein timing for said sampling is updated each time the electron beam is applied plural times.

3. An electron beam exposure method according to claim 1, wherein said first amount of trace deflection and said second amount of trace deflection are respectively defined as amounts obtained by digitally adding an offset.

4. A semiconductor device manufactured by using the electron beam exposure method according to claim 1.

5. An electron beam exposure apparatus wherein exposure is performed according to the deflection of an electron beam while a sample table with a sample placed thereon is being moved continuously, comprising:

a calculation unit for determining displacements of a position of said sample table and a position to apply the electron beam;

a first trace deflection correcting unit for determining a first amount of trace deflection for correcting said displacements in synchronism with shot timing provided to apply the electron beam;

a second trace deflection correcting unit for setting said first amount of trace deflection as the point of origin and determining a second amount of trace deflection for correcting the amount of a variation from the point of origin in a cycle shorter than a cycle for the correction executed by said first trace deflection correcting unit;

an adder for adding said first amount of trace deflection and said second amount of trace deflection to the amount of deflection of an electron beam for graphics exposure; and a deflector for performing said deflection according to the added deflection data to thereby prevent a glitch noise produced in the deflection of the electron beam.

6. An electron beam exposure apparatus according to claim 5, wherein when said first amount of trace deflection is added to the amount of deflection of the electron beam for the graphics exposure by said adder, said adder digitally adds said first amount of trace deflection and said amount of deflection for the exposure and thereafter the result of addition is converted into analog form, whereby said deflection is carried out.

7. An electron beam exposure apparatus according to claim 5, wherein when said first amount of trace deflection is added to the amount of deflection of the deflection beam for the graphics exposure by said adder, said first amount of trace deflection and said amount of deflection for said exposure are respectively converted into analog form and next analogically added together, and thereafter the result of addition is outputted to said deflector.

8. An electron beam exposure apparatus according to claim 5, wherein said first amount of trace deflection and said second amount of trace deflection are respectively defined as amounts obtained by digitally adding an offset.

* * * * *